US011603591B2

(12) United States Patent
Venkatasubramanian et al.

(10) Patent No.: US 11,603,591 B2
(45) Date of Patent: *Mar. 14, 2023

(54) PULSED PLASMA (DC/RF) DEPOSITION OF HIGH QUALITY C FILMS FOR PATTERNING

(71) Applicant: Applied Materials, Inc., Santa Clara, CA (US)

(72) Inventors: Eswaranand Venkatasubramanian, Santa Clara, CA (US); Yang Yang, San Diego, CA (US); Pramit Manna, Santa Clara, CA (US); Kartik Ramaswamy, San Jose, CA (US); Takehito Koshizawa, San Jose, CA (US); Abhijit B. Mallick, Fremont, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/982,955

(22) PCT Filed: Oct. 16, 2018

(86) PCT No.: PCT/US2018/056004
§ 371 (c)(1),
(2) Date: Sep. 21, 2020

(87) PCT Pub. No.: WO2019/212592
PCT Pub. Date: Nov. 7, 2019

(65) Prior Publication Data
US 2021/0040618 A1 Feb. 11, 2021

Related U.S. Application Data

(60) Provisional application No. 62/666,205, filed on May 3, 2018.

(51) Int. Cl.
C23C 16/26 (2006.01)
C23C 16/503 (2006.01)
(Continued)

(52) U.S. Cl.
CPC ........ C23C 16/503 (2013.01); C23C 16/4586 (2013.01); C23C 16/45502 (2013.01);
(Continued)

(58) Field of Classification Search
CPC ..... C23C 16/26; C23C 16/503; C23C 16/505; C23C 16/52; C23C 16/4586; C23C 16/45502
See application file for complete search history.

(56) References Cited

U.S. PATENT DOCUMENTS 6,682,786 B1 * 1/2004 Lien ................ G02F 1/133711
423/446
7,153,367 B2 * 12/2006 Lindenberg ............. C23C 16/54
156/345.31
(Continued)

FOREIGN PATENT DOCUMENTS

JP 62-116751 * 5/1987 ............. C22C 29/00
JP 2004249493 A 9/2004
(Continued)

OTHER PUBLICATIONS

Nagasawa, Hiroki, et al., "Plasma-enhanced chemical vapor deposition of amorphous carbon molecular sieve membranes for gas separation". RSC Adv., 2016, 6, 59045-59049.*
(Continued)

Primary Examiner — Bret P Chen
(74) Attorney, Agent, or Firm — Patterson & Sheridan, LLP; Chad M. Dougherty

(57) ABSTRACT

Methods for depositing an amorphous carbon layer onto a substrate, including over previously formed layers on the
(Continued)

substrate, use a plasma-enhanced chemical vapor deposition (PECVD) process. In particular, the methods utilize a combination of RF AC power and pulsed DC power to create a plasma which deposits an amorphous carbon layer with a high ratio of sp3 (diamond-like) carbon to sp2 (graphite-like) carbon. The methods also provide for lower processing pressures, lower processing temperatures, and higher processing powers, each of which, alone or in combination, may further increase the relative fraction of sp3 carbon in the deposited amorphous carbon layer. As a result of the higher sp3 carbon fraction, the methods provide amorphous carbon layers having improved density, rigidity, etch selectivity, and film stress as compared to amorphous carbon layers deposited by conventional methods.

15 Claims, 3 Drawing Sheets

(51) Int. Cl.
  *C23C 16/455* (2006.01)
  *C23C 16/458* (2006.01)
  *C23C 16/505* (2006.01)
  *C23C 16/52* (2006.01)
  *H01L 21/02* (2006.01)

(52) U.S. Cl.
  CPC ............ *C23C 16/505* (2013.01); *C23C 16/52* (2013.01); *H01L 21/02115* (2013.01); *H01L 21/02274* (2013.01); *H01L 21/02521* (2013.01)

(56) References Cited

U.S. PATENT DOCUMENTS

| | | | |
|---|---|---|---|
| 8,361,906 B2 | 1/2013 | Lee et al. | |
| 10,249,495 B2 | 4/2019 | Yang et al. | |
| 2003/0164142 A1 | 9/2003 | Koshimizu | |
| 2005/0142361 A1* | 6/2005 | Nakanishi | C23C 16/26 428/408 |
| 2006/0130971 A1* | 6/2006 | Chang | H01L 21/31116 156/345.43 |
| 2006/0263540 A1* | 11/2006 | Ramaswamy | H05H 1/46 427/569 |
| 2007/0032054 A1* | 2/2007 | Ramaswamy | H01L 21/0332 438/513 |
| 2008/0003824 A1* | 1/2008 | Padhi | H01L 21/31144 438/689 |
| 2008/0023440 A1 | 1/2008 | Chen et al. | |
| 2008/0153311 A1* | 6/2008 | Padhi | H01L 21/3146 438/780 |
| 2008/0188383 A1* | 8/2008 | Iseki | C23C 16/26 508/107 |
| 2008/0251206 A1 | 10/2008 | Nishio | |
| 2009/0169968 A1* | 7/2009 | Iseki | C23C 16/26 429/481 |
| 2009/0212010 A1 | 8/2009 | Wang et al. | |
| 2011/0244142 A1* | 10/2011 | Cheng | C23C 16/26 427/569 |
| 2011/0287633 A1* | 11/2011 | Lee | H01L 21/02274 438/725 |
| 2012/0015521 A1* | 1/2012 | Yu | H01L 21/0337 438/703 |
| 2012/0164834 A1* | 6/2012 | Jennings | H01J 37/32532 438/694 |
| 2012/0183887 A1* | 7/2012 | Iseki | H01M 4/663 429/518 |
| 2012/0282461 A1* | 11/2012 | Tsuji | C23C 16/505 428/338 |
| 2013/0052808 A1* | 2/2013 | Takaba | H01L 21/0228 257/E21.101 |
| 2013/0189845 A1* | 7/2013 | Kim | H01L 21/31144 438/696 |
| 2013/0302996 A1* | 11/2013 | Reilly | H01L 21/0262 438/758 |
| 2014/0170853 A1 | 6/2014 | Shamma et al. | |
| 2014/0273461 A1* | 9/2014 | Lee | C23C 16/26 438/694 |
| 2015/0371851 A1 | 12/2015 | Lee et al. | |
| 2016/0005602 A1* | 1/2016 | Yoo | H01L 21/31122 216/41 |
| 2016/0099147 A1* | 4/2016 | Kulshreshtha | C23C 16/45508 118/725 |
| 2016/0293609 A1* | 10/2016 | Jha | H01L 21/02274 |
| 2016/0314960 A1* | 10/2016 | Cheng | H01L 21/32 |
| 2017/0103893 A1 | 4/2017 | Kulshreshtha et al. | |
| 2018/0209037 A1* | 7/2018 | Citla | H01L 21/0332 |
| 2018/0358222 A1 | 12/2018 | Venkatasubramanian et al. | |
| 2019/0057862 A1 | 2/2019 | Yang et al. | |
| 2021/0043449 A1* | 2/2021 | Venkatasubramanian | H01L 21/0332 |

FOREIGN PATENT DOCUMENTS

| | | | | |
|---|---|---|---|---|
| JP | 2007005464 A | | 1/2007 | |
| JP | 2008541485 A | | 11/2008 | |
| JP | 2010024476 A | | 2/2010 | |
| JP | 2013540359 A | | 10/2013 | |
| JP | 2015501546 A | | 1/2015 | |
| KR | 10-2007-0074955 | * | 7/2007 | ........... H01L 21/027 |
| KR | 20120121340 A | | 11/2012 | |
| TW | 468209 B | | 12/2001 | |
| WO | 2013169427 A1 | | 11/2013 | |

OTHER PUBLICATIONS

Pang, Stella W., et al., "Amorphous Carbon Films as Planarization Layers Deposited by Plasma-Enhanced Chemical Vapor Deposition". IEEE Electron Device Letters, vol. 11, No. 9, Sep. 1990, pp. 391-393.*
Mori, Takanori, et al., "Growth process of hydrogenated amorphous carbon films synthesized by atmospheric pressure plasma enhanced CVD using nitrogen and helium as a dilution gas". Japanese Journal of Applied Physics 55, 045503 (2016) pp. 1-6.*
Tachibana, K., et al., "Diagnostics and modelling of a methane plasma used in the chemical vapour deposition of amorphous carbon films". J. Phys. D: Appl. Phys. 17 (1984) 1727-1742.*
Pang, S.W., et al., "Plasma-deposited amorphous carbon films as planarization layers". Journal of Vacuum Science & Technology B: Microelectronics Processing and Phenomena 8, 1980 (1990), 1 page. Abstract Only.*
Catherine, Y., et al., "Electrical characteristics and growth kinetics in discharges used for plasma deposition of amorphous carbon". Thin Solid Films, vol. 144, Issue 2, Nov. 15, 1986, 1 page. Abstract Only.*
Endo, Kazuhiko, et al., "Plasma deposition of low-dielectric-constant fluorinated amorphous carbon". Journal of Applied Physics vol. 86, No. 5, 2739-2745 (1999).*
Kleber, R., et al., "Influence of ion energy and flux composition on the properties of plasma-deposited amorphous carbon and amorphous hydrogenated carbon films". Diamond and Related Materials, 2 (1993)246-250.*
Oluwatosin, Olayinka, et al., "Overview of thin film deposition techniques". AIMS Materials Science, 6(2): 174-199.*
Singh, Vinay Kumar, "Versatility of Thin Film and Thin Film Deposition Techniques and Parameters". JETIR Oct. 2017, vol. 4, Issue 10, pp. 585-591.*
Stepinska, Izabela, et al., "The influence of PVD/CVD processes parameters on Ni catalyst nanoparticles sizes". IOP Conf. Series: Journal of Physics: Conf. Series 1033 (2018) 012007, pp. 1-9.*
Sobczak, Kamil, "Determination of Parameters Useful for the Control of the Average Size of Pd Nanoparticles for C-Pd Composite". Int J Thermophys (2015) 36:795-803.*
International Search Report and Written Opinion dated Feb. 12, 2019 for Application No. PCT/US2018/056004.

(56) References Cited

OTHER PUBLICATIONS

International Preliminary Report on Patentability dated Nov. 12, 2020 for application No. PCT/US2018/056004.
CN Office Action for Chinese Application No. 201880092808.3 dated Sep. 2, 2022.
JP Office Action for Japanese Application No. 2020-561008 dated Dec. 6, 2022.

\* cited by examiner

PULSED PLASMA (DC/RF) DEPOSITION OF HIGH QUALITY C FILMS FOR PATTERNING

BACKGROUND

Field

Embodiments of the present disclosure relate to methods for depositing an amorphous carbon layer onto a substrate, including over previously formed layers on the substrate, using a plasma-enhanced chemical vapor deposition (PECVD) process.

Description of the Related Art

Carbon hardmasks formed of amorphous carbon are used in semiconductor device manufacturing as an etching mask in forming high aspect ratio openings (e.g., a height to width ratio of 2:1 or more) in a substrate surface or in a material surface layer thereof. Generally, processing issues related to forming high aspect ratio openings, including clogging, hole-shape distortion, pattern deformation, top critical dimension blow up, line bending, and profile bowing are a result of undesirable material properties of conventionally deposited carbon hardmasks. For example, carbon hardmasks having one or both of lower material density and lower material rigidity (i.e., Young's modulus) are known to cause increased deformation of high aspect ratio openings when compared to hardmask materials having a higher density or higher rigidity.

Likewise, reduced etch selectivity between hardmask materials and substrate materials can cause increased slit pattern deformation and line bending as compared to hardmasks exhibiting higher etch selectivity. Similar problems may be caused by high film stress (compressive or tensile). Further, as critical dimensions (CDs) shrink and the magnitude of high aspect ratio openings increase, the thickness of conventionally deposited carbon hardmask used to form the high aspect ratio openings also increases. Unfortunately, hardmasks having lower transparency due to one or both of low optical K and increased thickness can cause misalignment in subsequent photolithography processes. Further, processes having lower etch selectivity between the hardmask material and the underlying substrate material often rely upon relativity thicker hardmasks which increase processing time and cost.

Accordingly, what is needed in the art are improved hardmasks and methods of forming improved hardmasks.

SUMMARY

In one embodiment, a method of processing a substrate is provided. The method includes positioning a substrate on a substrate support disposed in a process volume of a process chamber. The method further includes flowing a process gas comprising a hydrocarbon gas and a diluent gas into the process volume. The method further includes maintaining the process volume at a pressure less than about 100 mTorr. The method further includes forming a plasma of the process gas by applying a first power to a first electrode of the process chamber and applying a second power to a second electrode of the process chamber, wherein the second power is a pulsed DC power. The method further includes maintaining the substrate support at a temperature less than about 350° C. The method further includes exposing a surface of the substrate to the plasma. The method further includes depositing an amorphous carbon layer on the surface of the substrate.

In another embodiment, a method of processing a substrate is provided. The method includes positioning a substrate on a substrate support disposed in a process volume of a process chamber. The method further includes flowing a process gas comprising a hydrocarbon gas and a diluent gas into the process volume. The method further includes maintaining the process volume at a pressure less than about 20 mTorr. The method further includes forming a plasma of the process gas by applying an RF AC power to a first electrode of the process chamber, wherein the RF AC power is between about 500 W and 5 kW, with a frequency between about 350 kHz and about 100 MHz and applying a pulsed DC power to a second electrode of the process chamber, wherein the pulsed DC power is between about 200 W and about 15 kW pulsed at a frequency of about 1 kHz. The method further includes maintaining the substrate support at a temperature less than about 100° C. The method further includes exposing a surface of the substrate to the plasma. The method further includes depositing an amorphous carbon layer on the surface of the substrate.

In another embodiment, a carbon hardmask is provided. The carbon hardmask includes an amorphous carbon layer disposed on a surface of a substrate. The amorphous carbon layer has a density of more than about 1.8 g/cm$^3$, a Young's modulus of more than about 150 GPa, and a film stress of less than about 500 MPa.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of scope, for the disclosure may admit to other equally effective embodiments.

DETAILED DESCRIPTION

Embodiments of the present disclosure relate to methods for depositing an amorphous carbon layer onto a substrate, including over previously formed layers on the substrate, using a plasma-enhanced chemical vapor deposition (PECVD) process. In particular, the methods described herein utilize a combination of RF AC power and pulsed DC power to create a plasma which deposits an amorphous carbon layer with a high ratio of sp3 (diamond-like) carbon to sp2 (graphite-like) carbon. The methods also provide for lower processing pressures, lower processing temperatures, and higher processing powers, each of which, alone or in combination, may further increase the relative fraction of sp3 carbon in the deposited amorphous carbon layer. As a result of the higher sp3 carbon fraction, the methods described herein provide amorphous carbon layers having improved density, rigidity, etch selectivity, and film stress as compared to amorphous carbon layers deposited by conventional methods.

Figure 1:
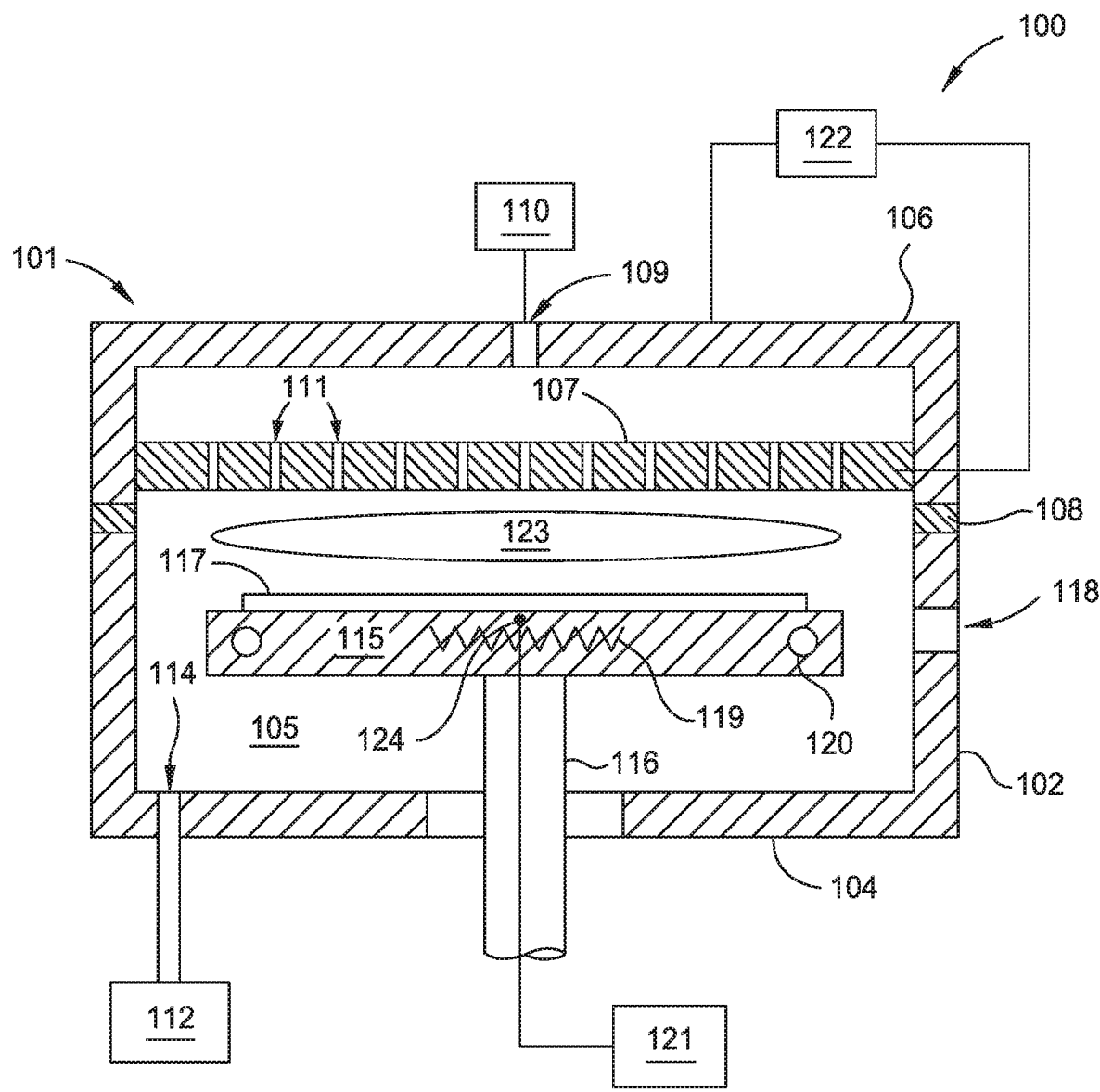
FIG. 1 illustrates a schematic cross-sectional view of an exemplary processing chamber used to practice the methods set forth herein, according to one embodiment.

FIG. 1 is a schematic cross sectional view of an exemplary processing chamber 100 used to practice the methods set forth herein, according to one embodiment. Other exemplary processing chambers that may be used to practice the methods describe herein include RADION™, PRODUCER®, and SYM3™ processing apparatus available from Applied Materials, Inc., of Santa Clara, Calif. as well as suitable deposition chambers from other manufacturers.

The processing chamber 100 includes a lid assembly 101, sidewalls 102, and a chamber base 104. The lid assembly 101 includes a chamber lid 106, a showerhead 107 coupled to the chamber lid 106 and in electrical communication therewith, and an electrically insulating ring 108 disposed between the chamber lid 106 and the sidewalls 102. The showerhead 107, the sidewalls 102, and the chamber base 104 together define a processing volume 105. In one embodiment, the chamber lid 106 and the showerhead 107 are formed from an electrically conductively material such as aluminum. A gas inlet 109 is disposed through the chamber lid 106 and fluidly coupled to a gas source 110. The showerhead 107, having a plurality of openings 111 disposed therethrough, is used to uniformly distribute processing gases from the gas source 110 into the processing volume 105. In other embodiments, the processing chamber 100 does not include a showerhead 107, and processing gases are delivered to the processing volume 105 through one or more gas inlets disposed through the chamber lid 106 or the sidewalls 102.

The processing volume 105 is fluidly coupled to a vacuum source 112, which may be one or more dedicated vacuum pumps, through a vacuum outlet 114, which maintains the processing volume 105 at sub-atmospheric conditions and evacuates the processing gas and other gases therefrom during processing. A substrate support 115, disposed in the processing volume 105, is disposed on a movable support shaft 116 extending through the chamber base 104. Herein, the processing chamber 100 is configured to facilitate transferring of a substrate 117 to and from the substrate support 115 through an opening 118 in one of the one or more sidewalls 102, which is sealed with a door or a valve (not shown) during substrate processing.

The substrate 117 is maintained at a desired processing temperature using one or both of a heater 119 and one or more cooling channels 120. The heater 119, which may be a resistive heater, and the one or more cooling channels are disposed in the substrate support 115. The one or more cooling channels 120 are fluidly coupled to a coolant source (not shown), such as a refrigerant source or a modified water source having relatively high electrical resistance. The heater 119 is in electrical communication with a power source (not shown) which is configured to power the heater 119 and elevate a temperature of the substrate support 115.

In some embodiments, one or more electrodes 124 are embedded in a dielectric material of the substrate support 115. The one or more electrodes are electrically coupled to a power supply 121. A power supply 122 is electrically coupled to the showerhead 107. For embodiments which do not include a showerhead, the power supply 122 is electrically coupled to the lid assembly 106. Each of the power supplies 121 and 122 may be a continuous wave (CW) RF power supply, a pulsed RF power supply, a DC power supply, and/or a pulsed DC power supply. In one embodiment, the power supply 121 is a CW RF power supply, and the power supply 122 is a pulsed DC power supply. In another embodiment, the power supply 121 is a pulsed DC power supply, and the power supply 122 is a pulsed RF power supply. While only two power supplies 121 and 122 are shown, it is contemplated that more power supplies may be coupled to electrodes in either the substrate support 115 or the lid assembly 101 as needed. For instance, pulsed DC power supplies may be coupled to electrodes in both the substrate support 115 and the lid assembly 101, along with an RF supply coupled to electrodes in the lid assembly 101.

In one embodiment, a plasma 123 is formed and maintained in the processing volume 105 by providing RF power from the power supply 122 to one or more electrodes in the lid assembly 101, thereby creating a capacitively coupled plasma 123. The plasma 123 is then modified by providing DC power from the power supply 121 to one or more electrodes disposed in the substrate support 115. In another embodiment, the plasma 123 is formed and maintained by RF power from the power supply 121 and modified by DC power from the power supply 122.

Figure 2:
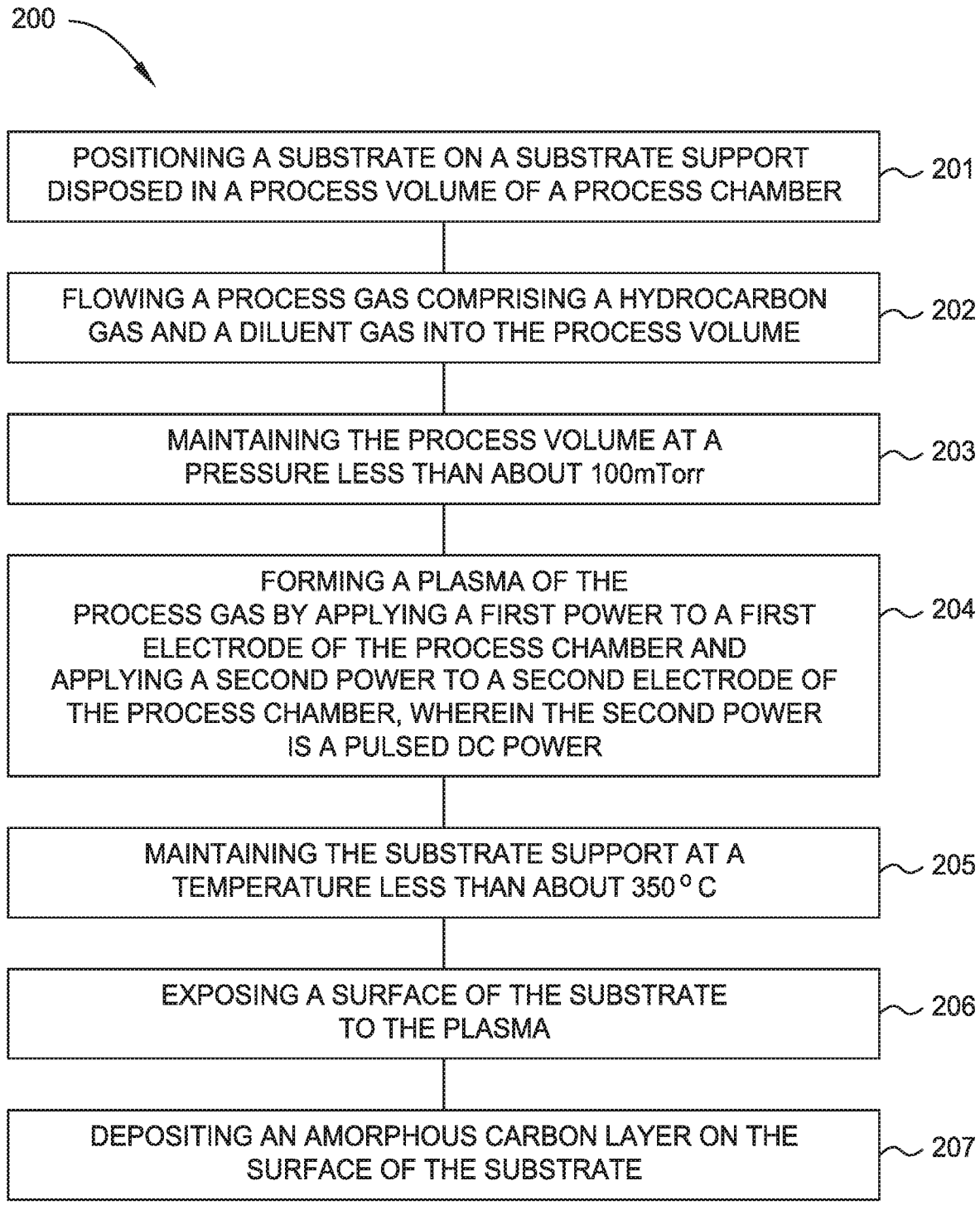
FIG. 2 illustrates a flow diagram of a method of depositing an amorphous carbon layer, according to one embodiment.

FIG. 2 is a flow diagram of a method 200 of depositing an amorphous carbon layer on a surface of a substrate, according to one embodiment. At operation 201 the method 200 includes positioning a substrate on a substrate support. The substrate support is disposed in a processing volume of a processing chamber, such as the processing chamber 100 described in FIG. 1. At operation 202 the method 200 includes flowing a processing gas into the processing volume. The processing gas includes a carbon source gas, such as a hydrocarbon gas, for example $CH_4$, $C_2H_2$, $C_3H_8$, $C_4H_{10}$, $C_2H_4$, $C_3H_6$, $C_4H_8$, $C_5H_{10}$, or combinations thereof. and the processing gas also includes a diluent gas, for example an inert gas such as Ar, He, Ne, Kr, Xe, or combinations thereof. In some embodiments, the diluent gas includes inert gases, such as a noble gases, $N_2$, $H_2$, or combinations thereof.

In some embodiments, a ratio of the flowrate of the hydrocarbon gas to the flowrate of the diluent gas is between about 1:10 and about 10:1, such as between about 1:5 and about 5:1. For example, in one embodiment a ratio of a flowrate of $C_2H_2$ to a flowrate of He is between about 1:3 and about 3:1. In some embodiments, the diluent gas includes $H_2$ and a ratio of the flowrate of $H_2$ to the flowrate of hydrocarbon gas is between about 0.5:1 and about 1:10, such as between about 1:1 and about 1:5.

At operation 203, the method 200 includes maintaining the processing volume at a processing pressure between about 0.1 mTorr and about 100 mTorr, such as between about 0.1 mTorr and about 50 mTorr, or between about 0.1 mTorr and about 30 mTorr, or between about 0.1 mTorr and about 20 mTorr, or between about 0.1 mTorr and about 15 mTorr, or between about 0.1 mTorr and about 10 mTorr, or less than about 100 mTorr, or less than about 50 mTorr, or less than about 20 mTorr, or less than about 15 mTorr, or less than about 10 mTorr.

At operation 204, the method 200 includes forming and maintaining a plasma of the processing gas by applying a first power to a first electrode of the processing chamber and applying a second power to a second electrode of the processing chamber, wherein the second power is a pulsed DC power. In one embodiment, the first electrode is disposed in the substrate support. In another embodiment, the first electrode is disposed opposite the substrate support, such as in a showerhead or chamber lid of the processing chamber. In one embodiment, the first power is an RF AC power between about 500 W and about 5 kW, such as about 2500 W. The first power has a frequency between about 350 kHz and about 100 MHz, such as 2 MHz or 13.56 MHz.

In one embodiment, the second electrode is disposed in the substrate support. In another embodiment, the second electrode is disposed opposite the substrate support. In one embodiment, the second electrode is a showerhead. In one embodiment, the second power is between about 200 W and about 15 kW. In another embodiment, the second power is pulsed at a frequency of about 1 kHz. In another embodiment, the second power has a duty cycle of about 50%.

It is believed that providing a pulsed DC power from the substrate support, as described above, results in greater uniformity of ion energies within the plasma, which in turn leads to a higher concentration of sp3 carbon in the deposited amorphous carbon layer. As described below with respect to FIG. 3, amorphous carbon layers with higher sp3 concentrations demonstrate desirable properties such as higher density, higher Young's modulus, and lower film stress as compared to conventionally-deposited amorphous carbon layers. It is further believed that providing a pulsed DC power opposite the substrate support, e.g., to a second electrode such as a showerhead, as described above, results in increased secondary electron emission from the second electrode, which can further reduce the film stress of the deposited amorphous carbon layer.

At operation 205 the method 200 includes maintaining the substrate support, and thus the substrate disposed thereon, at a temperature between about −50° C. and about 350° C., such as between about −50° C. and about 150° C., between about −50° C. and about 100° C., between about −50° C. and about 50° C., between about −25° C. and about 25° C., or a temperature less than about 350° C., such as less than about 200° C., less than about 150° C., less than 100° C., or less than about 50° C.

At operation 206, the method 200 includes exposing a surface of the substrate to the plasma. At operation 207, the method 200 includes depositing an amorphous carbon layer on the surface of the substrate.

While FIG. 2 illustrates one example of a flow diagram, it is to be noted that variations of method 200 are contemplated. For example, it is contemplated that operation 205 may occur prior to operation 202, 203, or 204. Additionally, it is contemplated that one or more of operations 202-207 may occur concurrently.

Figure 3:
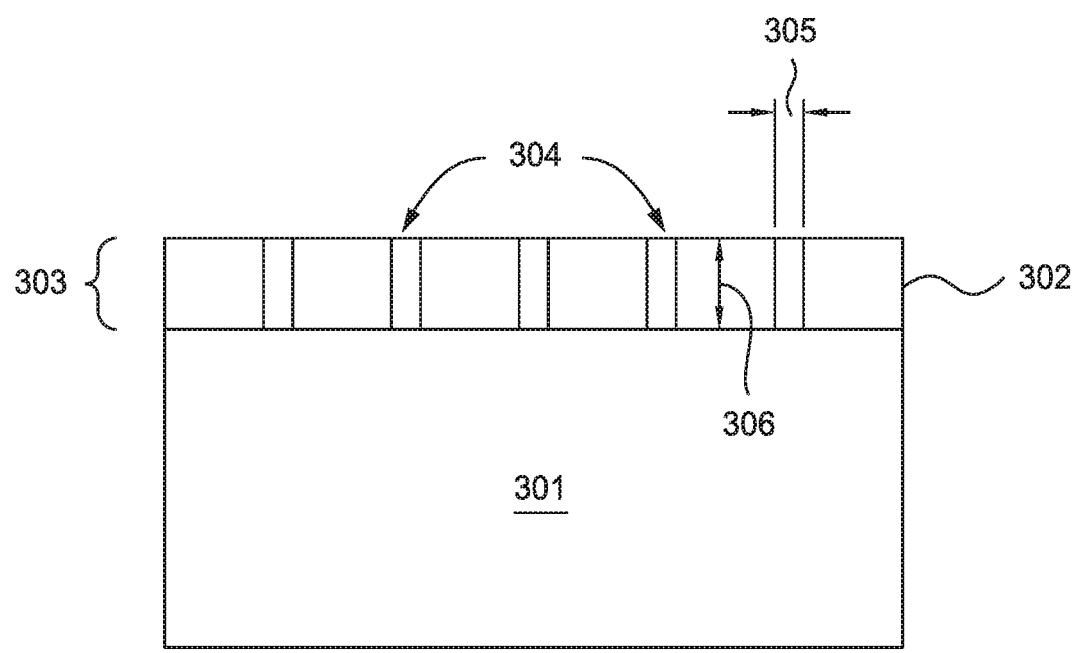
FIG. 3 illustrates a carbon hardmask formed of an amorphous carbon layer deposited according to the method set forth in FIG. 2, according to one embodiment.

FIG. 3 illustrates a carbon hardmask 303 deposited according to the method set forth in FIG. 2, according to one embodiment. The carbon hardmask 303, shown as a patterned carbon hardmask, includes an amorphous carbon layer 302, having a plurality of openings 304 formed therein, disposed on a to-be-patterned surface of a substrate 301. The substrate 301 or one or more material layers thereof are formed of one or a combination of crystalline silicon, silicon oxide, silicon oxynitride, silicon nitride, strained silicon, silicon germanium, tungsten, titanium nitride, doped or undoped polysilicon, carbon doped silicon oxides, silicon nitrides, doped silicon, germanium, gallium arsenide, glass, sapphire, and low k dielectric materials.

The amorphous carbon layer 302 has a thickness between about 1 kÅ and about 40 kÅ, such as between about 10 kÅ and about 40 kÅ or between about 10 kÅ and about 30 kÅ, a density of more than about 1.8 g/cm$^3$, and a Young's modulus of more than about 150 GPa. In one embodiment, the amorphous carbon layer 302 has a tensile or compressive film stress of less than about 500 MPa. In some embodiments, each of the openings 304 have an aspect ratio (i.e., a ratio of height 306 to width 305) of more than about 2:1, such as more than about 3:1, more than about 4:1, more than about 5:1, more than about 6:1, more than about 7:1, more than about 8:1, more than about 9:1, or more than about 10:1.

The methods described herein and the amorphous carbon layers deposited according to such methods exhibit desirable properties for carbon hardmask applications. The deposited amorphous carbon layers exhibit a high ratio of sp3 (diamond-like) carbon to sp2 (graphite-like) carbon. The methods also provide for lower processing pressures, lower processing temperatures, and higher processing powers, each of which, alone or in combination, may further increase the relative fraction of sp3 carbon in the deposited amorphous carbon layer. As a result of the higher sp3 carbon fraction, the methods described herein provide amorphous carbon layers having improved density, rigidity, etch selectivity, and film stress as compared to amorphous carbon layers deposited by conventional methods.

While the foregoing is directed to embodiments of the present disclosure, other and further embodiments of the disclosure may be devised without departing from the basic scope thereof, and the scope thereof is determined by the claims that follow.

The invention claimed is:

1. A method of processing a substrate, comprising:
positioning a substrate on a substrate support disposed in a process volume of a process chamber;
flowing a process gas comprising a hydrocarbon gas and a diluent gas into the process volume, a flowrate ratio of the hydrocarbon gas to the diluent gas being between about 1:10 and about 10:1;
maintaining the process volume at a pressure less than about 50 mTorr;
forming a plasma of the process gas by applying a first power to a first electrode of the process chamber and applying a second power to a second electrode of the process chamber, wherein the second power is a first pulsed DC power;
maintaining the substrate support at a temperature less than about 350° C.;
exposing a surface of the substrate to the plasma; and
depositing an amorphous carbon layer on the surface of the substrate.

2. The method of claim 1, wherein the amorphous carbon layer has a density of more than about 1.8 g/cm$^3$ and has a Young's modulus of more than about 150 GPa.

3. The method of claim 1, wherein the amorphous carbon layer has a film stress of less than about 500 MPa.

4. The method of claim 1, wherein the hydrocarbon gas comprises one of $CH_4$, $C_2H_2$, $C_3H_8$, $C_4H_{10}$, $C_2H_4$, $C_3H_6$, $C_4H_8$, $C_5H_{10}$, or a combination thereof.

5. The method of claim 4, wherein the temperature is less than about 100° C. and the pressure is less than about 20 mTorr.

6. The method of claim 5, wherein the diluent gas comprises $H_2$, and wherein a flowrate ratio of $H_2$ to the hydrocarbon gas is between about 0.5:1 and about 1:10.

7. The method of claim 1, wherein the first power is an RF AC power between about 500 W and 5 kW, with a frequency between about 350 kHz and about 100 MHz, and wherein the second power is between about 200 W and about 15 kW and is pulsed at a frequency of about 1 kHz.

8. The method of claim 1, wherein the first electrode is disposed in the substrate support and the second electrode is disposed opposite the substrate support and wherein the second electrode is a showerhead.

9. The method of claim 1, wherein the second electrode is disposed in the substrate support and the first electrode is disposed opposite the substrate support.

10. The method of claim 9, wherein:
a lid assembly of the process chamber includes a third electrode; and
the method further comprises:
applying a third power to the third electrode, the third power being a second pulsed DC power.

11. A method of processing a substrate, comprising:
positioning a substrate on a substrate support, the substrate support disposed in a process volume of a process chamber;
flowing a process gas comprising a hydrocarbon gas and a diluent gas into the process volume;
maintaining the process volume at a pressure less than about 20 mTorr;
forming a plasma of the process gas by applying an RF AC power to a first electrode of the process chamber, wherein the RF AC power is between about 500 W and 5 kW with a frequency between about 350 kHz and about 100 MHz and applying a first pulsed DC power to a second electrode of the process chamber, the second electrode disposed in the substrate support, wherein the first pulsed DC power is between about 200 W and about 15 kW;
maintaining the substrate support at a temperature less than about 100° C.;
exposing a surface of the substrate to the plasma; and
depositing an amorphous carbon layer on the surface of the substrate by plasma enhanced chemical vapor deposition.

12. The method of claim 11, wherein the hydrocarbon gas comprises one of $CH_4$, $C_2H_2$, $C_3H_8$, $C_4H_{10}$, $C_2H_4$, $C_3H_6$, $C_4H_8$, $C_5H_{10}$, or a combination thereof.

13. The method of claim 12, wherein the diluent gas comprises $H_2$, and wherein a flowrate ratio of $H_2$ to the hydrocarbon gas is between about 0.5:1 and about 1:10.

14. The method of claim 11, wherein the first electrode is disposed opposite the substrate support.

15. The method of claim 14, wherein:
a lid assembly of the process chamber includes a third electrode; and
the method further comprises:
applying a third power to the third electrode, the third power being a second pulsed DC power.

* * * * *